United States Patent
Liu

(10) Patent No.: US 8,020,611 B2
(45) Date of Patent: Sep. 20, 2011

(54) HEAT DISSIPATING DEVICE HAVING G-SHAPED HEAT PIPES AND HEAT SINKS

(75) Inventor: Peng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 520 days.

(21) Appl. No.: 12/233,601

(22) Filed: Sep. 19, 2008

(65) Prior Publication Data

US 2010/0073880 A1  Mar. 25, 2010

(51) Int. Cl.
*F28F 7/00* (2006.01)
*F28D 15/00* (2006.01)
*H05K 7/20* (2006.01)

(52) U.S. Cl. ............... 165/104.33; 165/80.3; 361/700; 361/702; 361/703; 361/704

(58) Field of Classification Search ............ 165/80.3, 165/104.33; 361/700, 702, 703, 704
See application file for complete search history.

(56) References Cited

U.S. PATENT DOCUMENTS

| 6,446,708 | B1 * | 9/2002 | Lai ............................ 165/80.3 |
|---|---|---|---|
| 6,945,319 | B1 * | 9/2005 | Li et al. .................. 165/104.33 |
| 7,059,391 | B2 * | 6/2006 | Whitney ................. 165/104.33 |
| 7,443,677 | B1 * | 10/2008 | Zhou et al. .................... 361/702 |
| 7,509,997 | B2 * | 3/2009 | Lin et al. ...................... 165/80.3 |
| 7,537,046 | B2 * | 5/2009 | Zheng et al. ................. 165/80.3 |
| 7,692,925 | B1 * | 4/2010 | Liu .............................. 361/700 |
| 2007/0047206 | A1 * | 3/2007 | Lee et al. .................... 361/703 |
| 2007/0095509 | A1 * | 5/2007 | Lee et al. ................. 165/104.33 |
| 2008/0314554 | A1 * | 12/2008 | Li ................................ 165/80.3 |
| 2009/0151895 | A1 * | 6/2009 | Liu ............................ 165/80.2 |

* cited by examiner

*Primary Examiner* — Cheryl J Tyler
*Assistant Examiner* — Brandon M Rosati
(74) *Attorney, Agent, or Firm* — Altis Law Group, Inc.

(57) ABSTRACT

A heat dissipation device includes two heat pipes, three extruded heat sinks and a heat conducting plate. Each heat pipe has a substantially G-shaped configuration and includes a heat absorbing section and first and second heat dissipating sections. The first and second heat dissipating sections extend along opposite directions, wherein the second heat dissipating section is located above the first heat dissipating section. Each heat sink includes a main body and a plurality of fins extending from the main body. The main body of each heat sink has a same profile with that of each heat pipe. Each heat pipe is sandwiched between the main bodies of two adjacent heat sinks. The heat conducting plate is attached to the main bodies of the heat sinks and the heat absorbing sections of the heat pipes.

10 Claims, 2 Drawing Sheets ly illustrating the principles of the present apparatus. Moreover, in the drawings, like reference numerals designate corresponding parts throughout the several views.

HEAT DISSIPATING DEVICE HAVING G-SHAPED HEAT PIPES AND HEAT SINKS

BACKGROUND OF THE INVENTION

1. Field of the Invention

The present invention relates to a heat dissipation device used in association with electronic components.

2. Description of Related Art

Computer electronic components, such as central processing units (CPUs), generate large amounts of heat during normal operation. If the heat is not properly dissipated, it can adversely affect operational stability of the electronic components and damage associated electronic devices. A heat dissipation device is often attached to a top surface of an electronic component to dissipate heat therefrom.

Conventionally, the heat dissipation device includes a base, a plurality of fins arranged on the base, and a plurality of heat pipes connecting the base and the fins. A plurality of grooves is defined in the base, and a plurality of holes is defined in the fins. Each heat pipe has a bent configuration and includes an evaporating section received in a corresponding groove of the base and a condensing section extending from the evaporating section. The condensing section is inserted in a corresponding hole of the fins. A cross-sectional configuration of each of the heat pipes is round. Due to a limited contacting area between the fins and the heat pipes, connection strength and reliability of the fins and the heat pipes completed by soldering are not so good that after a long time of use, the connection may be in a risk of failure, thereby decreasing the heat dissipating efficiency of the heat dissipation device.

Additionally, to define grooves in the base and holes in the fins increases complexity of the manufacture of the heat dissipation device, which accordingly increases cost of the heat dissipation device.

What is needed, therefore, is an improved heat dissipation device which can overcome the described limitation.

SUMMARY OF THE INVENTION

A heat dissipation device includes two heat pipes, three extruded heat sinks and a heat conducting plate located below the heat pipes and the heat sinks. The heat pipes each include a heat absorbing section, two connecting portions extending upwardly from two opposite ends of the heat absorbing portion, and first and second heat dissipating sections extending inwards from two ends of the connecting portions. The first and second heat dissipating sections are extended in opposite directions to each other. The second heat dissipating section is located above the first heat dissipating section. The three heat sinks each includes a main body and a plurality of fins extending from the main body. The main body of each of the three heat sinks has a same profile with that of the heat pipes. Each of the heat pipes is sandwiched between main bodies of two adjacent heat sinks. The heat conducting plate is attached to bottoms of the main bodies of the heat sinks and the heat absorbing sections of the heat pipes.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
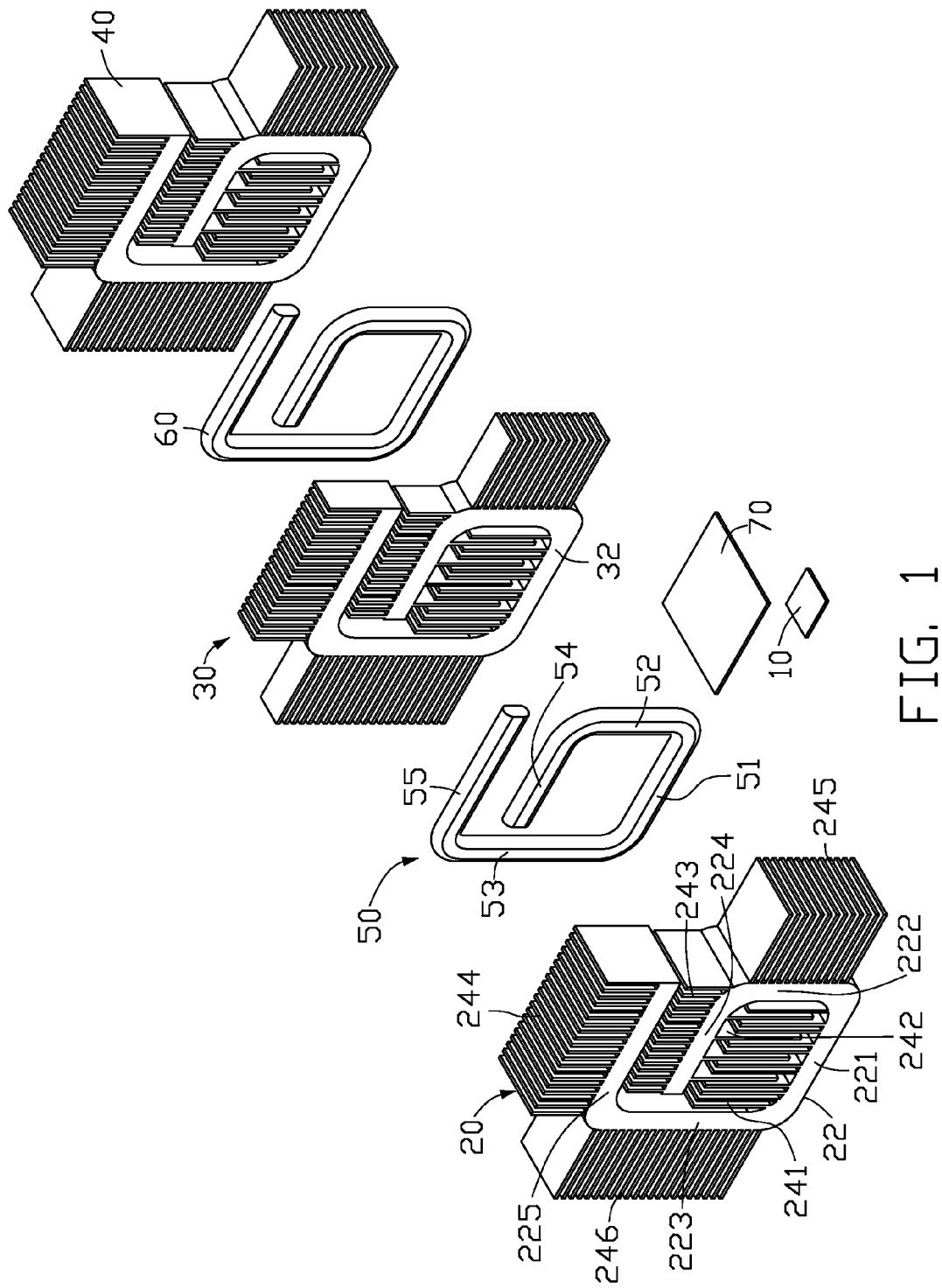
FIG. 1 is an exploded, isometric view of a heat dissipation device in accordance with a preferred embodiment of the present invention.
Figure 2:
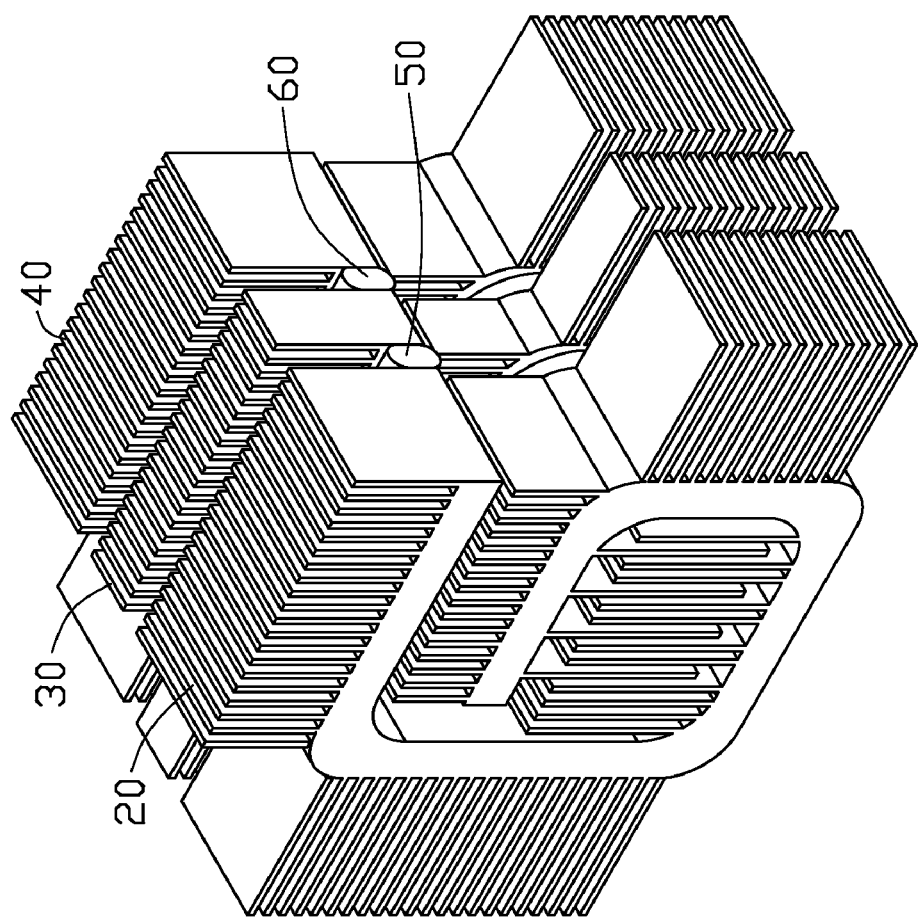
FIG. 2 is an assembled, isometric view of the heat dissipation device in FIG. 1.

Referring to FIGS. 1-2, a heat dissipation device in accordance with a preferred embodiment is adapted to dissipate heat generated by an electronic component 10, such as a CPU. The heat dissipation device comprises a heat conducting plate 70 thermally contacting the electronic component 10, three heat sinks (i.e., a first heat sink 20, a second heat sink 30 and a third heat sink 40) and two heat pipes (i.e., a first heat pipes 50 and a second heat pipe 60) mounted on the heat conducting plate 70. The first heat pipe 50 is sandwiched between the first heat sink 20 and the second heat sink 30. The second heat pipe 60 is sandwiched between the second heat sink 30 and the third heat sink 40.

In the present embodiment, the first and second heat pipes 50, 60 are flattened, with an oval cross section; this means that contact surfaces of the heat pipes 50, 60 with the first, second and third heat sinks 20, 30, 40 are planar. Therefore, contact areas between the first and second heat pipes 50, 60 and the first, second, third heat sinks 20, 30, 40 are increased. The first heat pipe 50 has an identical structure and function with the second heat pipe 60. Each of the first and second heat pipes 50, 60 comprises a heat absorbing section 51, a first and second heat dissipating sections 54, 55 parallel to the heat absorbing section 51, a first connecting section 52 interconnecting the heat absorbing section 51 and the first heat dissipating section 54, and a second connecting section 53 interconnecting the heat absorbing section 51 and the second heat dissipating section 55.

The heat absorbing section 51 is soldered on the heat conducting plate 70. The first and second connecting sections 52, 53 extend upwardly and perpendicularly from two opposite ends of the heat absorbing section 51. The first and second heat dissipating sections 54, 55 extend inwards and perpendicularly from free ends of the first and second connecting sections 52, 53, respectively, in opposite directions to each other. The second connecting section 53 is longer than the first connecting section 52, thereby making the second heat dissipating section 55 be located above the first heat dissipating section 54 and more far away from the heat absorbing section 51 than the first heat dissipating section 54. The heat absorbing section 51, the first and second connecting sections 52, 53, and the first and second heat dissipating sections 54, 55 are coplanar; thus, the first and second heat pipes 50, 60 substantially present a G-shaped configuration.

Each of the first, second, third heat sinks 20, 30, 40 is integrally formed of a metal with a good heat conductivity such as aluminum by extrusion. The first heat sink 20, second heat sink 30 and third heat sink 40 have the same configuration; however, the second heat sink 30 has a thickness smaller that that of the first and third heat sinks 20, 40. Each of the first heat sink 20 and the third heat sink 40 comprises a main body 22 and a plurality of fins extending from the main body 22.

The main body 22 is substantially G-shape, and has a same profile with the first and second heat pipes 50, 60 viewed from a front side thereof. Corresponding to the first and second heat pipes 50, 60, the main body 22 comprises a heat absorbing portion 221, a first and second heat dissipating portions 224, 225 parallel to the heat absorbing portion 221, and a first and second connecting portions 222, 223 interconnecting the heat absorbing portion 221 and the first and second heat dissipating portions 224, 225, respectively. A bottom surface of the heat absorbing portion 221 is flat and attached to the heat conducting plate 70. A rear side of the main body 22 of the first heat sink 20 is flat and used to be attached to the first heat pipe 50.

The fins extending from the main body 22 have a same width with the main body 22. The fins comprises a plurality of first fins 241, a plurality of second fins 242, a plurality of third fins 243, a plurality of fourth fins 244, a plurality of fifth fins 245 and a plurality of sixth fins 246. The first fins 241 extend upwardly from a top surface of the heat absorbing portion 221 of the main body 22. The second fins 242 extend downwardly from a bottom surface of the first heat dissipating portion 224 of the main body 22. The second fins 242 extend into the first fins 241, which means that each of the second fins 242 extends into a corresponding space defined by two neighboring first fins 241. The third fins 243 extend upwardly from a top surface of the first heat dissipating portion 224 of the main body 22. The fourth fins 244 extend upwardly from a top surface of the second heat dissipating portion 225. The first, second, third, fourth fins 241, 242, 243, 244 are parallel to each other. The fifth fins 245 extend outwards and horizontally from the first connecting portion 222. The sixth fins 246 extend outwards from the second connecting portion 223 and in a direction far away from the fifth fins 245. The fifth and sixth fins 245, 246 are parallel to each other and perpendicular to the first fins 241.

The second heat sink 30 also comprises a main body 32 and a plurality of fins extending from the main body 32.

Referring to FIG. 2 particularly, in assembly of the heat dissipation device, the first heat pipe 50 is sandwiched between the two main bodies 22, 32 of the adjacent first and second heat sinks 20, 30, the second heat pipe 60 is sandwiched between the two main bodies 32, 22 of the adjacent second and third heat sinks 30, 40. The first, second and third heat sinks 20, 30, 40 and the first and second heat pipes 50, 60 are located on the heat conducting plate 70. The heat absorbing sections 51 of the first and second heat pipes 50, 60 and bottom surfaces of the heat absorbing portions 221 of the main bodies 22, 32 of the three heat sinks 20, 30, 40 are coplanar and soldered to the heat conducting plate 70, whereby heat absorbed by the conducting plate 70 from the electronic component 10 can be dissipated to ambient air via the heat sinks and heat pipes 20, 30, 40, 50, 60.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
a heat pipe comprising a heat absorbing section adapted for receiving heat from an electronic component, first and second connecting sections extending upwardly from the heat absorbing section, and first and second heat dissipating sections extending inwards from two ends of the connecting sections along opposite directions; and
a first heat sink and a second heat sink, each of the first and second heat sinks comprising a main body and a plurality of fins extending from the main body, the main bodies of the first and second heat sinks each having a same profile with that of the heat pipe and sandwiching the heat pipe therebetween;
wherein each of the main bodies of the first and second heat sinks comprises a heat absorbing portion, and first and second heat dissipating portions located above the heat absorbing portion and parallel to each other;
wherein the fins of each of the first and second heat sinks comprise a plurality of first fins extending upwardly from the heat absorbing portion, a plurality of second fins extending downwardly from the first heat dissipating portion, a plurality of third fins extending upwardly from the first heat dissipating portion, and a plurality of fourth fins extending upwardly from the second heat dissipating portion, and the first, second, third and fourth fins are parallel to each other; and
wherein for each of the first and second heat sinks, the second fins extend into the first fins.

2. The heat dissipation device as claimed in claim 1, wherein the second heat dissipating section of the heat pipe is located above the first heat dissipating section of the heat pipe.

3. The heat dissipation device as claimed in claim 1, wherein each of the main bodies of the first and second heat sinks further comprises a first connecting portion interconnecting the heat absorbing portion and the first heat dissipating portion, and a second connecting portion interconnecting the heat absorbing portion and the second heat dissipating portion.

4. The heat dissipation device as claimed in claim 3, wherein the fins of each of the first and second heat sinks further comprise a plurality of fifth fins extending outwards from the first connecting portion, and a plurality of sixth fins extending outwards from the second connecting portion, and the fifth and sixth fins are parallel to each other and perpendicular to the first, second, third and fourth fins.

5. The heat dissipation device as claimed in claim 1, further comprising a heat conducting plate attached to the heat absorbing portions of the first and second heat sinks and the heat absorbing section of the heat pipe.

6. The heat dissipation device as claimed in claim 1, further comprising another heat pipe having an identical structure with the heat pipe, and another heat sink having an identical structure with the first heat sink, the another heat pipe being sandwiched between main bodies of the second heat sink and the another heat sink.

7. A heat dissipation device, comprising:
a heat pipe comprising a heat absorbing section, first and second heat dissipating sections located above and parallel to the heat absorbing section, a first connecting section interconnecting the heat absorbing section and the first heat dissipating section, and a second connecting section interconnecting the heat absorbing section and the second heat dissipating section, the first heat dissipating section being located between the heat absorbing section and the second heat dissipating section;
two extruded heat sinks each comprising a main body and a plurality of fins extending from the main body, the main bodies of the two heat sinks having a same profile with the heat pipe and sandwiching the heat pipe therebetween; and
a heat conducting plate located below the two heat sinks and the heat pipe and attached to the main bodies of the two heat sinks and the heat absorbing section of the heat pipe;
wherein the main body of each of the two heat sinks comprises a heat absorbing portion, a first connecting portion and a second connecting portion extending upwardly from two opposite ends of the heat absorbing portion, and a first heat dissipating portion and a second heat dissipating portion extending inwards from free ends of the first and second connecting portions, respectively;

wherein the fins of each of the two heat sinks comprise a plurality of first fins extending upwardly from the heat absorbing portion, and a plurality of second fins extending downwardly from the first heat dissipating portion; and wherein for each of the two heat sinks, the second fins extend into the first fins.

8. The heat dissipation device as claimed in claim 7, wherein the heat pipe further comprises a first connecting section interconnecting the heat absorbing section and the first heat dissipating section, and a second connecting section interconnecting the heat absorbing section and the second heat dissipating section.

9. The heat dissipation device as claimed in claim 7, wherein the fins of each of the two heat sinks further comprise a plurality of third fins extending upwardly from the first heat dissipating portion, a plurality of fourth fins extending upwardly from the second heat dissipating portion, a plurality of fifth fins extending outwards from the first connecting portion, and a plurality of sixth fins extending outwards from the second connecting portion, and the first, second, third, and fourth fins are parallel to each other and perpendicular to the fifth and sixth fins.

10. The heat dissipation device as claimed in claim 7, further comprising another heat pipe and another heat sink, the another heat pipe having an identical structure with the heat pipe, the another heat sink having a similar structure with the two heat sinks, and the another heat pipe being sandwiched between main bodies of the another heat sink and one of the heat sinks.

* * * * *